US005608763A

United States Patent [19]
Chiasson et al.

[11] Patent Number: 5,608,763
[45] Date of Patent: Mar. 4, 1997

[54] METHOD AND APPARATUS FOR DECODING A RADIO FREQUENCY SIGNAL CONTAINING A SEQUENCE OF PHASE VALUES

[75] Inventors: Gregory M. Chiasson, Barrington; Kevin L. Baum, Rolling Meadows, both of Ill.

[73] Assignee: Motorola, Inc., Schaumberg, Ill.

[21] Appl. No.: 175,892

[22] Filed: Dec. 30, 1993

[51] Int. Cl.$^6$ ............................................. H04L 27/22
[52] U.S. Cl. .......................... 375/332; 375/341; 375/331
[58] Field of Search .................................. 375/262, 279, 375/281, 341, 332, 329, 280, 331, 330; 329/304; 371/43, 37.1, 35

[56] References Cited

U.S. PATENT DOCUMENTS

| | | | |
|---|---|---|---|
| 4,748,682 | 5/1988 | Fukae et al. | 375/347 |
| 4,777,636 | 10/1988 | Yamashita et al. | 371/43 |
| 5,151,904 | 9/1992 | Reiner et al. | 375/43 |
| 5,202,903 | 4/1993 | Okanoue | 375/347 |
| 5,278,871 | 1/1994 | Rasky | 375/343 |
| 5,319,677 | 6/1994 | Kim | 375/347 |
| 5,351,274 | 9/1994 | Chennakeshu et al. | 375/341 |
| 5,392,300 | 2/1995 | Borth et al. | 371/43 |

OTHER PUBLICATIONS

"Digital Communication Fundamentals and Applications," Bernard Sklar, Prentice Hall, pp. 142–149 and 327–333.
Ariyavisitakul, Sirikiat, "Equalization of a Hard–Limited Slowly–Fading Multipath Signal Using a Phase Equalizer With Time–Reversal Structure", IEEE Journal on Selected Areas in Communications, vol. 10, No. 3, Apr. 1992, pp. 589–598.

Primary Examiner—Tesfaldet Bocure
Attorney, Agent, or Firm—Jon P. Christensen; Jeffrey G. Toler

[57] ABSTRACT

A method and an apparatus is provided for decoding a communicated radio frequency signal containing a sequence of phase values. The method includes the steps of amplitude limiting the communicated signal and maximum likelihood decoding the amplitude limited signal.

21 Claims, 2 Drawing Sheets

METHOD AND APPARATUS FOR DECODING A RADIO FREQUENCY SIGNAL CONTAINING A SEQUENCE OF PHASE VALUES

FIELD OF THE INVENTION

The field of the invention relates to decoding of radio frequency signals and in particular to maximum likelihood decoding of forward error correction encoded radio frequency signals.

BACKGROUND OF THE INVENTION

Multi-bit encoding of radio frequency (RF) signals is known in the art. Such encoding is possible by dividing the parameters (e.g., phase and/or amplitude) of the radio signal into a constellation of discrete values with each discrete value (symbol) representative of a particular bit sequence. Examples of such systems include quadrature phase shift keying (QPSK) modulation, or quadrature amplitude modulation (QAM).

Under QPSK, successive two-bit sequences may be communicated to a receiver based upon the phase of the transmitted symbol (e.g., a symbol with a phase in the first quadrant is representative of the bit sequence 00, a symbol with a phase in the second quadrant is representative of the bit sequence 10, etc.). FIG. 1 shows a QPSK constellation diagram.

Because the RF transmission medium is noisy, bit errors are likely to occur in the receiver. Encoding (sometimes referred to as channel encoding) is a well known method for reducing the probability of bit errors in the receiver. Convolutional encoding is a well known and effective encoding method. Convolutional encoding, a type of forward error correction coding, is also typically used with QPSK as a method of enhancing the recoverability of the data which was encoded. Decoding of a convolutionally encoded signal is often accomplished using a maximum likelihood decoder. Maximum likelihood decoding, in such a case, can be efficiently accomplished using the Viterbi algorithm (see *Error Correction Coding for Digital Communications*, by George C. Clark and J. Bibb Cain, Plenum Press).

Maximum likelihood decoding improves the accuracy of the decoded data by comparing a sequence of received symbols with each sequence of a known constellation of symbols that may have been transmitted. Each of the possible transmitted sequences is generally known as a codeword. The possible codewords are defined by the encoding method The comparison process selects the codeword closest to the received signal sequence (i.e., the codeword with the smallest total Euclidean distance separating the received symbol sequence and the codeword). Choosing the codeword such that the total Euclidean distance to the received symbol sequence is minimized corresponds to maximizing the cumulative likelihood or log-likelihood metric.

If all input message sequences are equally likely, a decoder that achieves the minimum probability of error is one that compares the conditional probabilities, also called the likelihood functions, $P(Z|U^{(m)})$, where Z is the received sequence and $U^{(m)}$ is one of the possible transmitted sequences, and chooses the sequence with the maximum cumulative log-likelihood metric. The decoder chooses $U^{(m')}$ if $P(Z|U^{(m')}) = \max P(Z|U^{(m)})$ for all $U^{(m)}$.

For each symbol within the symbol constellation, a metric is calculated by comparing the received symbol with this constellation symbol. This process is repeated for each symbol within the symbol constellation to form a metric set for each received symbol. For each codeword, a metric sequence is then identified through the metric sets. Within each metric sequence, the metric selected from each metric set is the metric associated with each symbol of the codeword. The metrics of each metric sequence are summed and the metric sequence with the largest sum is selected as the most likely. The codeword associated with the selected metric sequence is output the most likely codeword.

The above describes maximum likelihood decoding in its most general sense. In practical applications, maximum likelihood decoders have been designed for a zero-mean Gaussian channel. The effectiveness of such decoding is dependent upon a channel where the noise component of a received signal is a zero-mean Gaussian random variable. To ensure that the noise component is a zero-mean Gaussian random variable, the prior art has taught that a linear receiver must be used, since a linearly processed Gaussian random variable remains a Gaussian random variable. However, in a linear receiver, amplitude variations caused by fading or other short-term atmospheric perturbations must be controlled through the use of automatic gain control (AGC) circuitry in order to keep the received signal within the linear operating range of the receiver. Because of the difficulty and expense of constructing and maintaining linear receivers with AGC circuits, a need exists for a method of maximum likelihood decoding that works with a non-linear receiver (e.g., an amplitude limited, also known as a hard-limiting, receiver).

DETAILED DESCRIPTION OF THE PREFERRED EMBODIMENT

Figure 1:
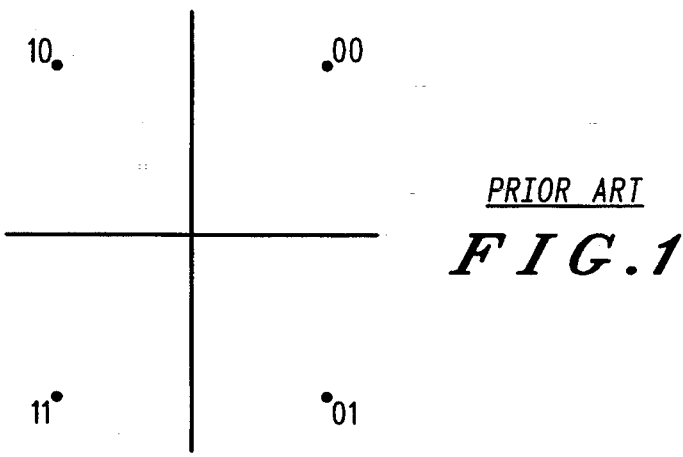
FIG. 1 is a prior art symbol constellation diagram.

The solution to the problem of maximum likelihood decoding of convolutionally encoded, amplitude limited signals lies, conceptually, in decoding the amplitude limited signal through the use of a maximum likelihood (ML) rule adapted for a non-Gaussian environment. Such an ML rule may be derived from known methods. Amplitude limiting is used in accordance with an embodiment of the invention to remove amplitude information while still maintaining the needed phase information of a received phase modulated signal.

The decoding method described under the invention has been developed for use with digital phase modulated signals (e.g., QPSK or differential QPSK) that have had their amplitude information removed by the receiver. Without the amplitude information, the amplitude limited received signal is in the form of phase angles or, equivalently, complex baseband signals having unity magnitude.

The maximum likelihood decoding method is developed by first considering the probability density function (PDF) of the phase error in the received signal due to additive white Gaussian noise. The phase error, $\Delta\theta_i$, at time i is defined as $\Delta\theta_i = \theta_i - \Phi_i$, where $\Phi_i$ is the transmitted phase value of a set of encoded phase values and $\theta_i$ is the noisy received phase value. If we define the signal to noise ratio (SNR) of the received signal at time i to be $\gamma_i$, then the probability distribution function (PDF) can be written as:

$$P(\Delta\theta_i) = \frac{1}{2\pi} e^{-\gamma_i} \left( 1 + \sqrt{2\gamma_i} \cos(\Delta\theta_i) e^{\gamma_i(\cos\Delta\theta_i)^2} \int_{-\infty}^{\sqrt{2\gamma_i}\cos\Delta\theta_i} e^{\frac{x^2}{2}} dx \right) \quad (1)$$

This PDF is difficult to work with because of its complexity. However, a simplified PDF, which is a good approximation to $P(\Delta\theta_i)$, is known and can be written as:

$$\hat{P}(\Delta\theta_i) = \sqrt{\frac{\gamma_i}{\pi}} \, e^{-2\gamma_i(1-\cos\Delta\theta_i)} \quad (2)$$

The derivation of this PDF can be better understood by referring to *Equalization of a Hard-limited Slowly-fading Multipath Signal Using a Phase Equalizer with Time-reversal Structure* (Sirikiat Ariyavisitakul, IEEE Journal on Selected Areas of Communications, Vol. 10, No. 3, April 1992).

The logarithm of the simplified PDF can now be used to define a maximum likelihood decoding rule (MLR) for the hard-limited receiver. Generally, it is more computationally efficient to use the logarithm of the PDF since this permits the simple multiplication of elements instead of the evaluation of exponents. We are able to use this transformation because the logarithm is a monotonically increasing function and thus will not alter the final result in our codeword selection. The MLR may now be written as:

$$MLR = \max \sum_{i=0}^{N-1} \left( \frac{1}{2} \ln\left(\frac{\gamma_i}{\pi}\right) - 2\gamma_i(1-\cos\Delta\theta_i) \right)$$

where the phase error is now defined as $\Delta\theta_i = \theta_i - \Phi'_i$, and $\Phi'_i$ is one of the possible transmitted phases at time i. The maximization is performed over the set of all possible code words, and N is the codeword length. (Note that for QPSK modulation $\Phi'_i$ can take any of 4 possible values at each time instant). Since the MLR depends only on selecting the codeword $\Phi'(N)$ that maximizes the above expression relative to another choice of $\Phi'(N)$, it can be simplified significantly by eliminating terms that do not depend on the particular choice of $\Phi'_i$. It can be shown that the only portion of the ML rule that depends on $\Phi'_i$ is the cosine term. Therefore, an equivalent, but simplified MLR that can be used to select the codeword $\Phi'(N)$ is as follows:

$$MLR = \max \sum_{i=0}^{N-1} \gamma_i \cos(\Delta\theta_i).$$

Under an embodiment of the invention, the simplified ML rule provides a method of maximum likelihood decoding of hard limited signals. At each time instant, the cosine of the phase differences between the received signal and each of the possible transmitted signals is computed and weighted by a signal to noise ratio. The sequence $\Phi'(N)$ that maximizes the simplified MLR is then selected.

The simplified MLR may be flier manipulated to develop a low complexity Viterbi decoder which allows the use of correlation metrics, standard deinterleaver configurations, and baseband signal representations while remaining optimal for hard-limited signals. First, the values previously defined for $\Delta\theta_i$ are substituted as follows:

$$MLR = \max \sum_{i=0}^{N-1} \gamma_i \cos(\theta_i - \Phi'_i)$$

where the expression $\gamma_i \cos(\theta_i - \Phi'_i)$ is a metric and where the calculation of the metric for all $\Phi'_i$ determines a metric set.

The modified ML rule can be re-written using angle difference trigonometric identities as:

$$MLR = \max \sum_{i=0}^{N-1} \gamma_i(\cos(\theta_i)\cos(\Phi'_i) + \sin(\theta_i)\sin(\Phi'_i))$$

To allow for baseband signal representations, we note that the complex baseband representation of an amplitude limited signal is a complex number having a phase angle equal to $\theta_i$, and unity magnitude. The complex baseband representation of a received signal corresponding to angle $\theta_i$ is:

$$e^{j\theta_i} = \cos(\theta_i) + j\sin(\theta_i)$$

We next define a new complex variable, $Z_i$, as:

$$Z_i = \gamma_i(\cos(\theta_i) + j\sin(\theta_i))$$

Substituting the complex variable, $Z_i$, into the modified ML rule provides a resultant final ML rule as follows:

$$MLR = \max \sum_{i=0}^{N-1} \cos(\Phi'_i)Re(Z_i) + \sin(\Phi'_i)Im(Z_i) \quad (3)$$

where the expression, $$\cos(\Phi'_i)Re(Z_i) + \sin(\Phi'_i)Im(Z_i), \quad (4)$$

provides an alternate form of a metric and where the calculation of the metric for all $\Phi'_i$ determines a metric set.

It should be noted the $Re(Z_i)$ is simply the weighted in-phase component of the hard-limited received signal and that $Im(Z_i)$ is the weighted quadrature component of the received signal. Since the signal to noise weighting is applied only to the received signal, there is a single scaled baseband signal to be deinterleaved. The use of the single baseband signal allows the inventive decoder to be compatible with standard deinterleaver structures.

Further simplification can be obtained by noting that $\Phi'_i$, the angle of a possible transmitted phase, can only take on a finite number of values; therefore, the quantities $\cos(\Phi'_i)$ and $\sin(\Phi'_i)$ may be precalculated and stored, thus eliminating the need for any trigonometric function evaluations. Within the framework of the QPSK example discussed herein, $\Phi'_i$ can take on only four values. Furthermore, due to the symmetry of the QPSK constellation, the results for only one value of $\Phi'_i$ need to be stored. The size of this storage can be reduced by observing that a constant scaling does not affect the maximum likelihood decoding process. Thus, the cosine and sine results may be scaled to plus or minus one. In this case, the computations in the decoding process have been reduced to the simplest form of the correlation metric, i.e., a simple addition or subtraction of the weighted baseband signal components.

Figure 3:
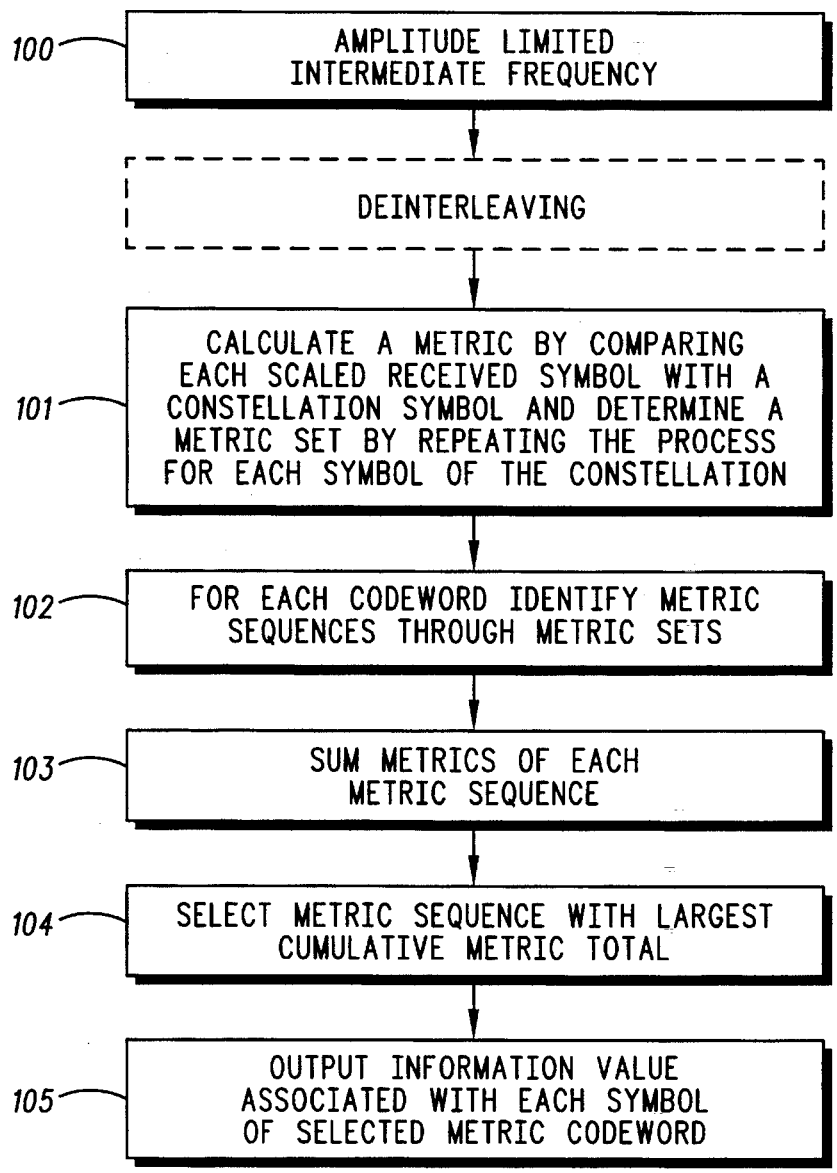
FIG. 3 is a flow chart of signal decoding in accordance with an embodiment of the invention.
Figure 2:
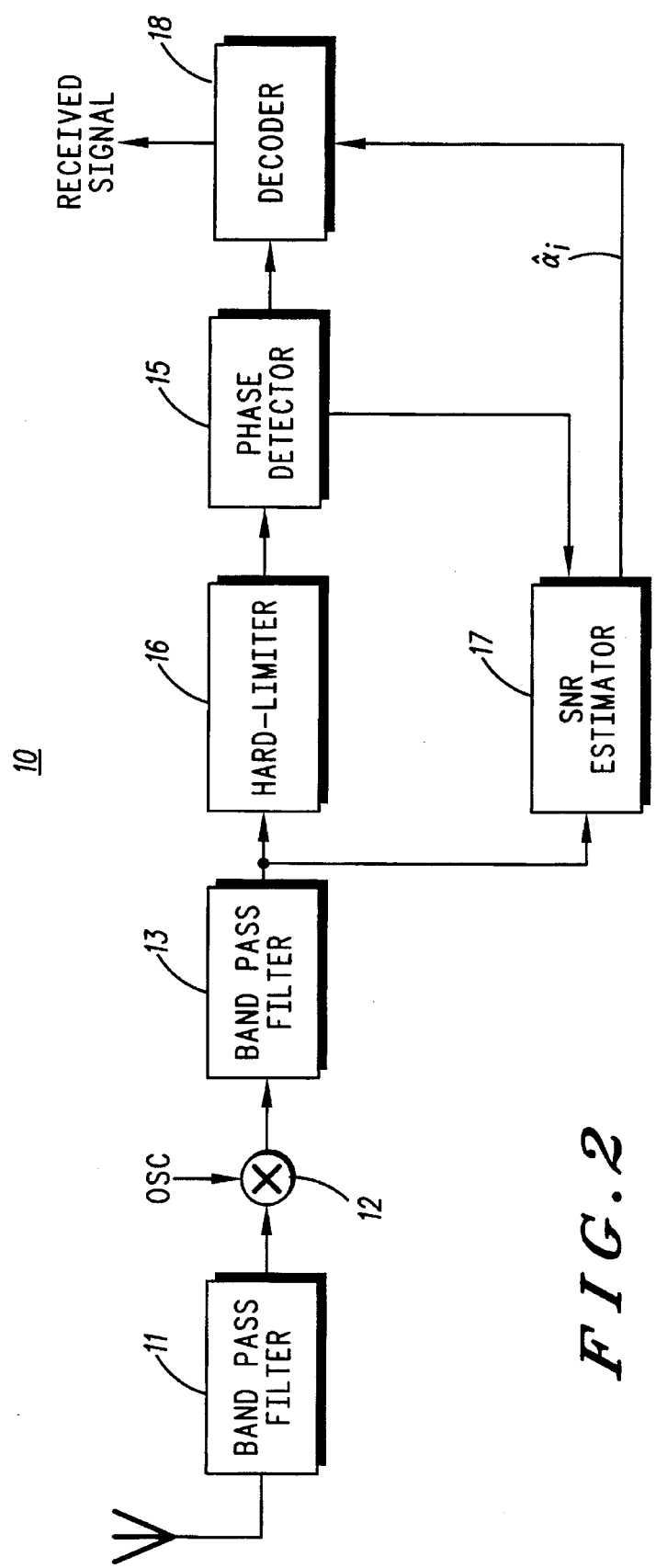
FIG. 2 is a block diagram of a receiver in accordance with an embodiment of the invention.

By way of example, FIG. 2 is a block diagram of a receiver 10 in accordance with an embodiment of the invention. FIG. 3 is a flow chart of signal decoding under an embodiment of the invention. Reference will be made to FIGS. 2 and 3 as appropriate to an understanding of the invention.

Within the receiver 10, a signal received by an antenna is filtered in band-pass filters (BPFs) 11 and 13 and mixed with outputs of an oscillator in mixer 12 to downconvert the signal to an intermediate frequency (IF) state. The IF signal is amplitude-limited 100 within a hard-limiter 16 before phase detection within a phase detector 15 and decoding within a decoder 18. An SNR value of the received signal is also estimated. (A received signal strength indication (RSSI) may also be used as an input for SNR estimation within the SNR estimator 17.) The estimation value is provided as a second input to the decoder 18 as an estimate, $\hat{\gamma}_i$, of the actual SNR, $\gamma_i$.

If RSSI information is not available, or if interference other than thermal noise is significant, phase processing techniques can be used to estimate $\gamma_i$. Equation 1 and Equation 2 demonstrate that the probability density function for the phase error depends on $\gamma_i$. Hence we can estimate $\gamma_i$ by computing one of the statistics of the phase error such as the mean square value of the phase error. This can be done most accurately when a training sequence is transmitted to the receiver such that the phase error can be precisely computed. When a training sequence is not available, the phase error statistics can be estimated by comparing the received phase values to an estimate of the transmitted phase values. In sub-optimal implementations, $\gamma_i$ can be estimated by any function that is monotonically related to $\gamma_i$.

The output of the phase detector block 15 and the SNR estimator 17 are provided as inputs to the decoder 18. (If interleaving is used, de-interleaving is accomplished within the decoder 18.) For each symbol within the symbol constellation, a metric is calculated by comparing the scaled received symbol (scaled by $\hat{\gamma}_i$) with the constellation symbol in accordance with Expression 4. This process is repeated for each symbol within the symbol constellation to form a metric set 101 for each received symbol. For each codeword, a metric sequence is then identified 102 through the metric sets. Within each metric sequence, the metric selected from each metric set is the metric associated with each symbol of the codeword. The metrics of each metric sequence are summed 103 and the metric sequence with the largest sum is selected 104 as the most likely in accordance with Equation 3. The codeword associated with the selected metric sequence is output as the most likely codeword. An information value associated with each symbol of the selected codeword is then output 105. The Viterbi algorithm can be used to efficiently implement the described decoding process.

A variation of the previously described embodiment of the invention can also be used to decode signals that have been bit interleaved before transmission and de-interleaved prior to ML decoding. As is apparent from the definition of a metric (Expression 4), decoding is based on the values of the in-phase and quadrature components of the complex baseband signal representation. If bit interleaving is used, the de-interleaved values can be grouped in pairs of bits with the first element of each pair representing the in-phase component and the second element of each pair representing the quadrature component. Decoding may the be accomplished as described in the preferred embodiment of the invention.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art (e.g., application of the invention to other types of phase modulation), it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

We claim:

1. A method of decoding a forward error correction encoded communicated radio frequency signal containing a sequence of phase values, such method comprising the steps of:

amplitude limiting the communicated signal to form an amplitude limited signal;

determining a set of metrics in response to the amplitude limited signal by comparing each phase value of the sequence of phase values with a plurality of constellation symbols and scaling a function of each phase value of the sequence of phase values by a corresponding estimated signal to noise ratio for each phase value of the sequence of phase values to form a plurality of metric sets; and maximum likelihood decoding the amplitude limited signal based on the plurality of metric sets.

2. The method as in claim 1 further comprising the stop of:

identifying a plurality of metric sequences through the metric sets with one metric per metric set.

3. The method as in claim 2 further comprising the stop of:

summing the metrics of each metric sequence.

4. The method as in claim 3 further comprising the step of selecting the summed metric sequence having a greatest likelihood and outputting an information value associated with the selected sequence.

5. An apparatus for decoding a forward error correction encoded communicated radio frequency signal containing a sequence of phase values, such apparatus comprising:

means for amplitude limiting the communicated signal;

means for determining a set of metrics by comparing each phase value of the sequence of phase values with a set of constellation symbols and scaling a function of each phase value of the sequence of phase values by a corresponding estimated signal to noise ratio for each phase value of the sequence of phase values to form a plurality of metric sets; and means for maximum likelihood decoding the amplitude limited signal based on the plurality of metric sets.

6. The apparatus as in claim 5 further comprising means for identifying a plurality of metric sequences through the metric sets with one metric per metric set.

7. The apparatus as in claim 6 further comprising means for summing the metrics of each metric sequence.

8. The apparatus as in claim 7 further comprising means for selecting the summed metric sequence having a greatest likelihood and outputting an information value associated with the selected sequence.

9. A method of maximum likelihood decoding a forward error correction encoded amplitude limited communicated radio frequency signal containing a sequence of phase values, such method comprising the steps of:

A) determining a set of metrics for each phase value by comparing each phase value of the sequence of phase values with a set of estimated transmitted phase values and by scaling a function of each phase value of the sequence of phase values by a corresponding estimated signal to noise ratio for each phase value of the sequence of phase values to form a plurality of metric sets;

B) identifying a plurality of metric sequences by projecting the metric sets with one metric per metric set;

C) summing the metrics of each metric sequence to form a summed output; and

D) outputting an information value associated with each metric of a metric sequence of the plurality of metric sequences with a greatest likelihood based on the summed output.

10. The method of claim 9, wherein said step of projecting comprises a functional mapping.

11. An apparatus for maximum likelihood decoding a forward error correction encoded amplitude limited radio frequency communicated signal containing a sequence of phase values, such apparatus comprising:

A) a first processor for determining a set of metrics for each phase value by comparing each phase value of the sequence of phase values with a set of encoded phase values and by scaling a function of each phase value of the sequence of phase values by a corresponding estimated signal to noise ratio for each phase value of the sequence of phase values to form a plurality of metric sets;

B) a second processor for identifying a plurality of metric sequences by projecting the metric sets with one metric per metric set;

C) a summer for summing the metrics of each metric sequence;

D) a selector responsive to the summer for selecting the metric sequence with a greatest likelihood; and, E) an output responsive to the selector for outputting an information value based on the selected metric sequence, the information value associated with each metric of a metric sequence of the plurality of metric sequences with said greatest likelihood.

12. The apparatus as in claim 11 wherein the a selector for selecting the metric sequence with a greatest likelihood further comprises a comparator for identifying the metric sequence with a largest sum.

13. A method of maximum likelihood decoding a forward error correction encoded communicated signal containing a sequence of phase values, such method comprising the steps of:

A) hard limiting amplitude variations from the communicated signal;

B) comparing based on a functional mapping of each phase value of the sequence of phase values with each of a predetermined set of encoded phase values to form a set of metrics for each phase value;

C) scaling a function of each phase value of the sequence of phase values by a corresponding estimated signal to noise ratio for each phase value of the sequence of phase values and identifying a plurality of metric sequences based on each metric in each of the metric sets;

D) summing the metrics of each metric sequence;

E) selecting the metric sequence providing the largest sum; and,

F) outputting the information value of the known set of possible encoded phase values associated with each metric of the metric sequence with the largest sum as the most likely information sequence.

14. The method as in claim 13 wherein the step of determining a set of metrics for each phase value further comprises the step of scaling a function of each phase value of the sequence of phase values and each phase value of a set of encoded phase values by a corresponding estimated signal to noise ratio for each phase value of the sequence of phase values.

15. The method of claim 13, wherein the functional mapping comprises a trigonometric function.

16. A method of maximum likelihood signal decoding a forward error correction encoded communicated signal containing a sequence of phase values, such method comprising the steps of:

A) hard limiting amplitude variations from the communicated signal;

B) generating a complex baseband representation of each phase value;

C) scaling the complex baseband representation of each phase value of the sequence of phase values by a corresponding estimated signal to noise ratio for each phase value of the sequence of phase values D) determining a metric from the scaled complex baseband representation of each phase value of the sequence of phase values and a known set of constellation symbols to form a set of metrics for each phase value;

E) identifying a plurality of metric sequences through the metric sets, including one metric from each set;

F) summing the metrics of each metric sequence;

G) selecting, in response to the step of summing, the metric sequence with a greatest likelihood; and, H) outputting the information value of the known set of constellation symbols associated with each metric of the metric sequence with the greatest likelihood.

17. The method as in claim 16 wherein the step of selecting the metric sequence with a greatest likelihood further comprises the step of selecting the metric set with a largest sum.

18. The method as in claim 16 further comprising the step of deinterleaving each scaled complex representation of each phase value of the sequence of phase values before determining a metric.

19. The method as in claim 16 further comprising the step of scaling a function of each phase value of a set of encoded phase values to a unit value before determining the metric of each complex baseband representation of each phase value.

20. The method as in claim 19 wherein the step of determining a metric from the scaled complex representation and unit value scaled function of each phase value further comprises the generation of a correlation metric.

21. The method as in claim 16 further comprising the step of Viterbi decoding.

* * * * *

UNITED STATES PATENT AND TRADEMARK OFFICE
CERTIFICATE OF CORRECTION

PATENT NO. : 5,608,763
DATED : March 4, 1997
INVENTOR(S) : Chiasson, et al.

It is certified that error appears in the above-indentified patent and that said Letters Patent is hereby corrected as shown below:

Column 6, line 22 reads "the stop" should be --the step--.

Column 6, line 26 reads "the stop" should be --the step--.

Signed and Sealed this

Fifteenth Day of July, 1997

Attest:

Attesting Officer

BRUCE LEHMAN

Commissioner of Patents and Trademarks